US012336392B2

(12) United States Patent
Ye (10) Patent No.: US 12,336,392 B2
(45) Date of Patent: Jun. 17, 2025

(54) TOUCH ELECTRODE STRUCTURE AND TOUCH DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

( * ) Notice: Subject to any disclaimer, the term of this patent is extended or adjusted under 35 U.S.C. 154(b) by 1079 days.

(21) Appl. No.: 16/966,003

(22) PCT Filed: Jul. 21, 2020

(86) PCT No.: PCT/CN2020/103342
§ 371 (c)(1),
(2) Date: Jul. 30, 2020

(87) PCT Pub. No.: WO2021/258470
PCT Pub. Date: Dec. 30, 2021

(65) Prior Publication Data
US 2023/0200145 A1  Jun. 22, 2023

(30) Foreign Application Priority Data

Jun. 22, 2020  (CN) .................. 202010571273.7

(51) Int. Cl.
*H10K 59/123* (2023.01)
*G06F 3/041* (2006.01)
(Continued)

(52) U.S. Cl.
CPC ......... *H10K 59/123* (2023.02); *G06F 3/0412* (2013.01); *G06F 3/0445* (2019.05);
(Continued)

(58) Field of Classification Search
CPC ... G06F 3/0445; G06F 3/0446; H10K 59/123; H10K 59/124; H10K 59/40; H10K 59/12
See application file for complete search history.

(56) References Cited

U.S. PATENT DOCUMENTS

2014/0347299 A1* 11/2014 Lu .................. G06F 3/0446
345/173
2015/0268761 A1*  9/2015 Yang ............... G06F 3/0446
345/174
(Continued)

FOREIGN PATENT DOCUMENTS

| CN | 103186306 A | 7/2013 |
|----|-------------|--------|
| CN | 107003769 A | 8/2017 |

(Continued)

OTHER PUBLICATIONS

International Search Report in International application No. PCT/CN2020/103342, mailed on Mar. 11, 2021.
(Continued)

*Primary Examiner* — Sonya McCall-Shepard (57) ABSTRACT

The present application provides a touch electrode structure and a touch display panel. The touch electrode structure includes: a first touch electrodes including first main electrodes, branch electrodes including a first branch portion and a second branch portion intersecting each other; second touch electrodes including second main electrodes, wherein at least one of the branch electrodes is provided with a first hollow portion, or/and at least one of the second touch electrodes is provided with a second hollow portion disposed outside the second main electrodes.

16 Claims, 5 Drawing Sheets

(51) Int. Cl.
  *G06F 3/044* (2006.01)
  *H10K 59/12* (2023.01)
  *H10K 59/124* (2023.01)
  *H10K 59/40* (2023.01)

(52) U.S. Cl.
  CPC ......... *G06F 3/0446* (2019.05); *H10K 59/124* (2023.02); *H10K 59/40* (2023.02)

(56) References Cited

U.S. PATENT DOCUMENTS

| | | | |
|---|---|---|---|
| 2017/0024033 A1 | 1/2017 | Chandran et al. | |
| 2017/0185180 A1* | 6/2017 | Chae | G06F 3/0412 |
| 2018/0188852 A1* | 7/2018 | Choi | G06F 3/0446 |
| 2018/0224968 A1* | 8/2018 | Church | G06F 3/0448 |

FOREIGN PATENT DOCUMENTS

| | | |
|---|---|---|
| CN | 108415629 A | 8/2018 |
| CN | 109375840 A | 2/2019 |
| CN | 109669573 A | 4/2019 |
| CN | 110764660 A | 2/2020 |
| CN | 110928436 A | 3/2020 |
| CN | 111158516 A | 5/2020 |
| CN | 212276386 U | 1/2021 |

OTHER PUBLICATIONS

Written Opinion of the International Search Authority in International application No. PCT/CN2020/103342, mailed on Mar. 11, 2021.

Chinese Office Action issued in corresponding Chinese Patent Application No. 202010571273.7 dated May 23, 2024, pp. 1-8.

* cited by examiner

TOUCH ELECTRODE STRUCTURE AND TOUCH DISPLAY PANEL

BACKGROUND OF INVENTION

Field of Invention

The present application relates to a field of display, in particular to a touch electrode structure and a touch display panel.

Description of Prior Art

Capacitive touch screens are widely used in various electronic interactive scene devices due to their high durability, long service life, and support for multi-touch functions. The working principle of the capacitive touch screen is to detect a specific position touched by a finger by detecting change in capacitance at the touch position of the finger.

At present, in an AMOLED On-cell display (integrating a touch layer on a cover plate of a flexible active-matrix organic light-emitting diode (AMOLED)), a touch electrode is usually made directly on an upper surface of a thin film encapsulation layer. However, because the thin film encapsulation layer is thin (typically less than 10 um), a distance between the touch electrode and the cathode is small, which results in a large parasitic capacitance between the touch electrode and the cathode, and thus a large RC delay of a channel of the touch electrodes at a far end of a large-sized touch screen, thereby resulting in a significant decrease in a scanning frequency of the touch electrode, which in turn leads to a reduction in key performance such as a touch report rate.

Therefore, the existing AMOLED On-cell display has a problem of low touch report rate, which needs to be resolved.

SUMMARY OF INVENTION

The present application provides a touch electrode structure and a touch display panel to improve the AMOLED On-cell display screen, which has the problem of low touch report rate.

The present application provides a touch electrode structure, which includes:
a plurality of first touch electrodes arranged in parallel, wherein the first touch electrodes include a plurality of first main electrodes connected end to end along a first direction and continuously conducted and branch electrodes connected to the first main electrodes, each of the branch electrodes includes a first branch portion and a second branch portion, the first branch portion is connected to the first main electrodes, the second branch portion is cross-connected to the first branch portion without contacting the first main electrodes; and
a plurality of second touch electrodes arranged in parallel, wherein the second touch electrodes include a plurality of second main electrodes connected end to end in a second direction and continuously conducted, the second touch electrodes arranged around the branch electrodes and the first main electrodes, and electrically insulated from the first touch electrodes; the second direction and the first direction are perpendicular to each other, the first touch electrodes and the second touch electrodes intersect each other to form a plurality of repeatedly arranged touch units,
wherein at least one of the branch electrodes is provided with a first hollow portion, or/and at least one of the second touch electrodes is provided with a second hollow portion disposed outside the second main electrodes.

In the touch electrode structure provided by the present application, at least one of the branch electrodes is provided with the first hollow portion, and the touch electrode structure further includes a first floating electrode disposed in at least one of the first hollow portion and electrically insulated from the branch electrodes.

In the touch electrode structure provided by the present application, at least one of the second touch electrodes is provided with the second hollow portion, and the touch electrode structure further includes a second floating electrode disposed in at least one of the second hollow portion and electrically insulated from the second touch electrodes.

In the touch electrode structure provided by the present application, in the touch units, an effective area of each of the first touch electrodes is smaller than an effective area of each of the second touch electrodes, the effective area of the touch electrodes refers to an area excluding an area of the first hollow portion, and the effective area of each of the second touch electrodes refers to an area excluding an area of the second hollow portion.

In the touch electrode structure provided by the present application, in the touch units, a ratio of an area of the first hollow portion to an effective area of each the first touch electrodes is less than 1, and the effective area of each of the first touch electrodes refers to an area excluding an area of the first hollow portion.

In the touch electrode structure provided by the present application, in the touch units, a ratio of an area of the second hollow portion to an effective area of each of the second touch electrodes is less than 1, and the effective area of each of the second touch electrodes refers to an area excluding an area of the second hollow portion.

In the touch electrode structure provided by the present application, the first touch electrodes are arranged at intervals along the second direction, and a number of the first touch electrodes is even.

In the touch electrode structure provided by the present application, in the touch units, the first main electrodes include a first centerline along the first direction and a second centerline along the second direction, and the first main electrodes is symmetrical with respect to the first centerline and symmetrical with respect to the second centerline.

In the touch electrode structure provided by the present application, the second touch electrodes are symmetrical with respect to the first centerline and symmetrical with respect to the second centerline.

In the touch electrode structure provided by the present application, each of the branch electrodes are connected to one of opposite ends of the first main electrodes, and the branch electrodes are not in contact with each other.

In the touch electrode structure provided by the present application, each of the branch electrodes are connected to a middle portion of one of the first main electrodes.

In the touch electrode structure provided by the present application, wherein the touch units include four touch sub-units, the first branch portion is disposed on a diagonal of each of the touch sub-units, and the second branch portion is disposed on another diagonal of each of the touch sub-units.

In the touch electrode structure provided by the present application, wherein the first branch portion includes a connection portion and a first branch, and the first branch is connected to one of the first main electrodes through the connection portion.

In the touch electrode structure provided by the present application, each of the first main electrodes has a geometric shape of rectangle having a long side along the first direction, and the connection portion has a geometric shape of a right angle triangle having a right-angled side flush with a width side of each of the main electrodes, another right-angled side sharing a same edge with the long side of the first main electrode, and a hypotenuse sharing a same edge with the first branch.

In the touch electrode structure provided by the present application, the touch electrode structure further includes a third floating electrode disposed between adjacent ones of the second touch electrodes to electrically isolate the second touch electrodes, and the third floating electrode is electrically insulated from the second touch electrodes and the first touch electrodes.

In the touch electrode structure provided by the present application, a length of each of the first branch portion and the second branch portion is less than half a diagonal of each of the touch units, the length of the first branch portion refers to a length in an extension direction of the first branch portion, and the length of the second branch portion refers to a length in an extension direction of the second branch portion.

In the touch electrode structure provided by the present application, a width of the first branch portion is less than or equal to a width of each of the first main electrodes, a width of the second branch is less than or equal to the width of the first branch portion, the width of each of the first main electrodes refers to a length of the first main electrodes in the second direction, the width of the first branch portion refers to a length in a direction perpendicular to the extension direction of the first branch portion, and the width of the second branch portion refers to a length in a direction perpendicular to the extension direction of the second branch portion.

In the touch electrode structure provided by the present application, the width of each of the first main electrodes is greater than or equal to a maximum distance between five adjacent sub-pixels and less than or equal to a maximum distance between twenty adjacent sub-pixels, the width of the first branch portion is greater than or equal to a maximum distance between two adjacent sub-pixels and less than or equal to the maximum distance between five adjacent sub-pixels, and the width of the second branch portion is less than or equal to the maximum distance between five adjacent sub-pixels.

In the touch electrode structure provided by the present application, a width of the third floating electrode is greater than a width of one sub-pixel and less than or equal to a maximum distance between two adjacent sub-pixels.

Meanwhile, the present application also provides a touch display panel, which includes:
- a display layer;
- a thin film encapsulation layer arranged on the display layer; and
- a touch layer disposed on the thin film encapsulation layer, wherein the touch layer includes the touch electrode structure according to any one of the touch electrode structures provided by the present application.

The present application provides a touch electrode structure and a touch display panel. The touch electrode structure includes: a plurality of first touch electrodes arranged in parallel, wherein the first touch electrodes include a plurality of first main electrodes connected end to end along a first direction and continuously conducted and branch electrodes connected to the first main electrodes, each of the branch electrodes includes a first branch portion and a second branch portion, the first branch portion is connected to the first main electrodes, the second branch portion is cross-connected to the first branch portion without contacting the first main electrodes; and a plurality of second touch electrodes arranged in parallel, wherein the second touch electrodes include a plurality of second main electrodes connected end to end in a second direction and continuously conducted, the second touch electrodes arranged around the branch electrodes and the first main electrodes, and electrically insulated from the first touch electrodes; the second direction and the first direction are perpendicular to each other, the first touch electrodes and the second touch electrodes intersect each other to form a plurality of repeatedly arranged touch units, wherein at least one of the branch electrodes is provided with a first hollow portion, or/and at least one of the second touch electrodes is provided with a second hollow portion disposed outside the second main electrodes. In the touch electrode structure, the arrangement of the first hollow portion in the branch electrode reduces the parasitic capacitance between the first touch electrode and the cathode, and the arrangement of the second hollow portion in the second touch electrode reduces the parasitic capacitance between the second touch electrode and the cathode, thereby effectively reducing the RC delay of the first touch electrodes and the second touch electrodes, reducing the time required for screen scanning, and thereby effectively increasing the touch report rate. The arrangement of the first main electrodes facilitates the conduction of current in a direction of a channel of the first touch electrodes, greatly reducing the impedance of a channel of the touch electrodes, and the arrangement of the second main electrodes facilitates the conduction of current in a direction of a channel of second first touch electrodes, greatly reducing the impedance of a channel of the touch electrodes, thereby effectively reducing the RC delay of the first touch electrodes, reducing the time required for screen scanning, and thereby effectively increasing the touch report rate. In addition, the arrangement of the branch electrodes and the arrangement of the second touch electrode around the branch electrodes and the first main electrodes improve the coupling effect between the first touch electrodes and the second touch electrodes, which effectively elevates a mutual capacitance value between the first touch electrodes and the second touch electrodes, such that a higher touch mutual capacitive signal amount is ensured, and touch sensitivity is improved.

BRIEF DESCRIPTION OF DRAWINGS

The technical solutions and other beneficial effects of the present application will be apparent through the detailed description of the specific embodiments of the present application in conjunction with the accompanying drawings.

DETAILED DESCRIPTION OF PREFERRED EMBODIMENTS

In order to solve the problem of low touch report rate in the existing AMOLED On-cell display screen, the present application provides a design of a touch electrode structure, which ensures a high touch mutual capacitive signal amount while the resistance of the touch electrode is maintained as small as possible, and reducing the parasitic capacitance between the touch electrode and a cathode, thereby effectively reducing a charging time of the touch electrode, increasing a scanning frequency of the touch electrode, and realizing a high report rate of the touch screen.

Figure 1:
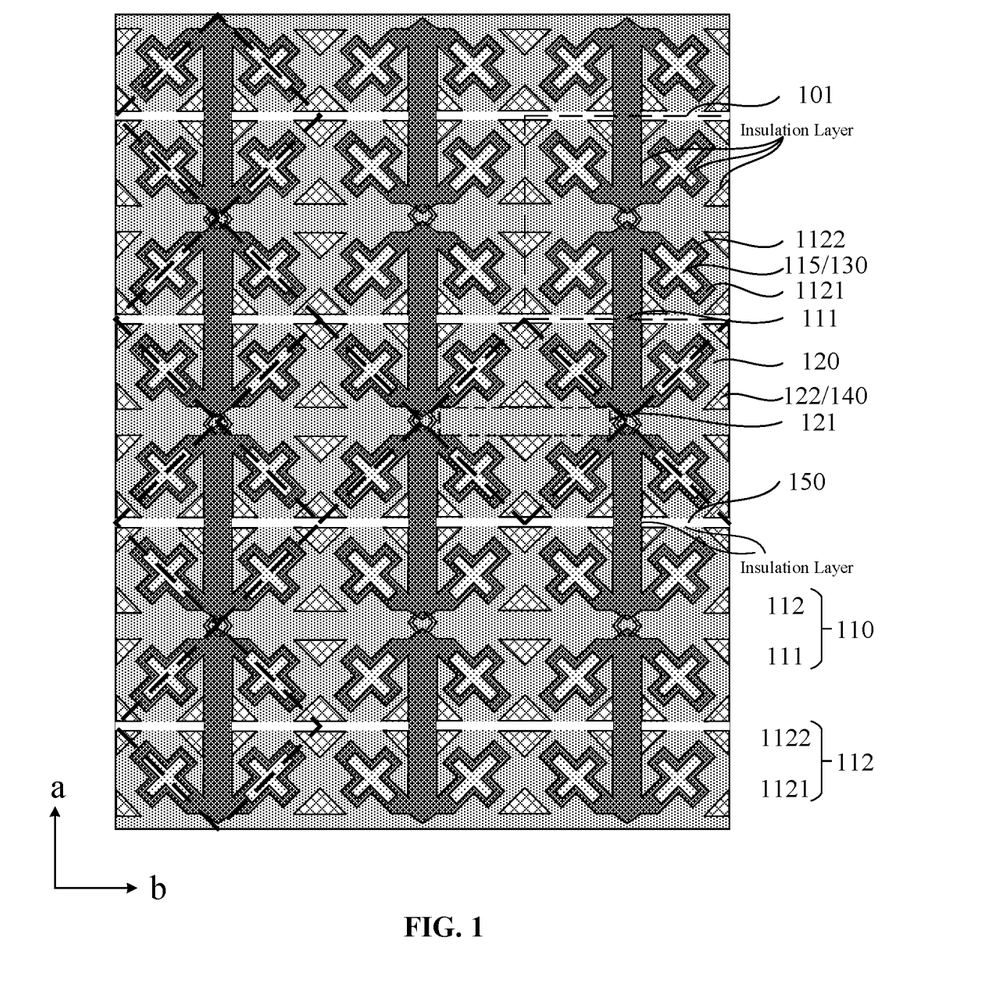
FIG. 1 is a schematic diagram of a touch electrode structure provided by an embodiment of the present application.

Referring to FIG. 1, FIG. 1 is a schematic diagram of a touch electrode structure provided by an embodiment of the present application. As shown in the FIG. 1, the touch electrode structure provided by the embodiment of the present invention includes:

a plurality of first touch electrodes 110 arranged in parallel, wherein the first touch electrodes 110 include a plurality of first main electrodes 111 connected end to end along a first direction a and continuously conducted and branch electrodes 112 connected to the first main electrodes 111, each of the branch electrodes 112 includes a first branch portion 1121 and a second branch portion 1122, the first branch portion 1121 is connected to the first main electrodes 111, the second branch portion 1122 is cross-connected to the first branch portion 1121 without contacting the first main electrodes 111; and a plurality of second touch electrodes 120 arranged in parallel, wherein the second touch electrodes 120 include a plurality of second main electrodes 121 connected end to end in a second direction b and continuously conducted, the second touch electrodes 120 arranged around the branch electrodes 112 and the first main electrodes 111, and electrically insulated from the first touch electrodes 111; the second direction b and the first direction a are perpendicular to each other, the first touch electrodes 110 and the second touch electrodes 120 intersect each other to form a plurality of repeatedly arranged touch units 101.

At least one of the branch electrodes 112 is provided with a first hollow portion 115, or/and at least one of the second touch electrodes 120 is provided with a second hollow portion 122 disposed outside the second main electrodes 121.

This embodiment provides a touch electrode structure. In the touch electrode structure, the arrangement of the first hollow portion in the branch electrode reduces the parasitic capacitance between the first touch electrode and the cathode, and the arrangement of the second hollow portion in the second touch electrode reduces the parasitic capacitance between the second touch electrode and the cathode, thereby effectively reducing the RC delay of the first touch electrodes and the second touch electrodes, reducing the time required for screen scanning, and thereby effectively increasing the touch report rate. The arrangement of the first main electrodes facilitates the conduction of current in a direction of a channel of the first touch electrodes, greatly reducing the impedance of a channel of the touch electrodes, and the arrangement of the second main electrodes facilitates the conduction of current in a direction of a channel of second first touch electrodes, greatly reducing the impedance of a channel of the touch electrodes, thereby effectively reducing the RC delay of the first touch electrodes, reducing the time required for screen scanning, and thereby effectively increasing the touch report rate. In addition, the arrangement of the branch electrodes and the arrangement of the second touch electrode around the branch electrodes and the first main electrodes improve the coupling effect between the first touch electrodes and the second touch electrodes, which effectively elevates a mutual capacitance value between the first touch electrodes and the second touch electrodes, such that a higher touch mutual capacitive signal amount is ensured, and touch sensitivity is improved.

In the touch electrode structure provided by the embodiment of the present application, the first touch electrodes 110 are touch driving electrodes, and the second touch electrodes 120 are touch sensing electrodes. The first touch electrodes 110 extend along the first direction a and are continuously conducted to form electrode channels along the first direction a, and the first touch electrodes 110 are spaced apart from each other in parallel along the second direction b. The second touch electrodes 120 extend along the second direction b and are continuously connected to form electrode channels along the second direction b. The second touch electrodes 120 are spaced apart from each other in parallel along the first direction a.

In the touch electrode structure provided by an embodiment of the present application, as shown in FIG. 1, a number of channels of the first touch electrodes 110 is smaller than a number of channels of the second touch electrodes 120, or the number of channels of the first touch electrodes 110 is greater than the number of channels of the second touch electrodes 120. The number of channels of the first touch electrodes 110 and the number of channels of the second touch electrodes 120 are set to be even, preferably a multiple of 2, 4, 8, or 16 to avoid the existence of an odd number of channels. Further, the number of channels of the first touch electrodes 110 and the number of channels of the second touch electrodes 120 are integer multiples of the number of electrode channels included in a single scan.

When the first touch electrodes are scanned, the electrode channels are usually grouped in multiples of 2, 4, 8, or 16 for scanning, that is, each multiple of multiples of 2, 4, 8, or 16 of electrode channels are included in a corresponding number of scanning wave groups of single square waves for driving, and a number of the square waves included in each of the scanning wave groups is the same as the multiple. For example, each of the scanning wave groups includes 4 single square waves, and the number of electrode channels of the first touch electrodes in a single scan is 4. If the number of channels of the first touch electrodes 110 is set to 17, 4 scans can only complete the scanning of 16 channels of the touch electrodes, and the remaining (the 17th) channel of the touch electrodes needs one additional scan, that is, a total of 5 scans are required to complete the scan operation of all the channels of the touch electrodes. If the first touch electrodes is set to 16, then only 4 scans are required to complete the whole scan operation of the channel of the touch electrodes, so that the total scanning time generated will be reduced by 20% compared with the case where the number of channels of the first touch electrodes 110 is set to 17, which greatly increases the time required for screen scanning, and greatly increasing the touch report rate.

In one embodiment, at least one of the branch electrodes 112 is provided with the first hollow portion 115, and by providing the first hollow portion 115 in the branch electrode 112, the parasitic capacitance between the second touch electrode and the cathode is reduced, thereby effectively reducing the RC delay of the channels of the first touch electrodes, reducing the time required for screen scanning, and thereby effectively increasing the touch report rate.

In the first embodiment, referring to FIG. 1, the first touch electrodes 110 are continuously conducted along the first direction a, and as shown in FIG. 1, a diamond-shaped structure along the first direction a is used to transmit a touch driving signal. The second touch electrodes 120 are continuously conducted along the second direction b, and as shown in FIG. 1, a diamond-shaped chain structure along the second direction b is used to transmit a touch sensing signal. The first touch electrodes 110 and the second touch electrodes 120 are insulated from each other, the first direction a is a vertical direction in FIG. 1, and the second direction b is a horizontal direction in FIG. 1. The first touch electrodes 110 and the second touch electrodes 120 intersect each other, and the first touch electrodes 110 and the second touch electrodes 120 form a plurality of repeatedly arranged touch units 101.

Each of the first main electrodes 111 has a shape of rectangle having a long side along the first direction a, and a width which is a lateral distance of the rectangular main electrode 111 in the figure and greater than or equal to a maximum distance between five adjacent sub-pixels and less than or equal to a maximum distance between twenty adjacent sub-pixels. By providing a rectangular main electrode 111 extending across the entire electrode channel in a direction of the electrode channels of the first touch electrodes 110 while ensuring that the rectangular first main electrodes 111 has a certain channel width, the impedance of the channels of the first touch electrodes is greatly reduced, which is conducive to the conduction of current on the channel of the touch electrodes, thereby effectively reducing the RC delay of the first touch electrodes, reducing the time required for screen scanning, and thus effectively improving the touch report rate.

Figure 2:
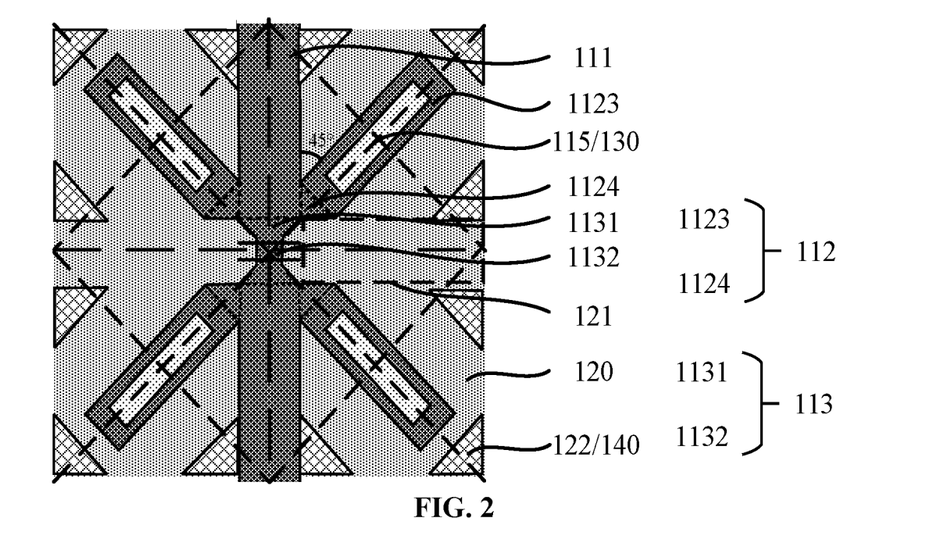
FIG. 2 is a schematic structural diagram of a touch unit provided by a first embodiment of the present application.

Referring to FIG. 2, FIG. 2 illustrates a schematic structural diagram of a touch unit provided by a first embodiment of the present application. Two adjacent first main electrodes 111 are connected to each other by a channel electrode 113, and the channel electrode 113 includes a first channel portion 1131 and a second channel portion 1132, wherein the first channel portion 1131 is connected to one of the first main electrodes 111, and the second channel portion 1132 is connected to the first channel portion 1131. The first channel portion 1131 and the second channel portion 1132 are disposed in a layer same as the first main electrodes 111, and adjacent ones of the second touch electrodes 120 are electrically connected to each other through a bridge electrode.

Each of the branch electrodes 112 is connected to one of opposite ends of each of the first main electrodes 111, and form a preset angle with the first main electrodes 111, which is 30° to 60°. In the touch unit, the first main electrodes 111 include a first centerline along the first direction a and a second centerline along the second direction b, and the branch electrodes 112 are bilaterally symmetrical with respect to the first centerline and vertically symmetrical with respect to the second centerline. As shown in FIG. 1, each of the first main electrodes 111 is connected to four branch electrodes 112, and the branch electrodes 112 are regularly arranged outside the opposite long sides of the first main electrodes 111, respectively.

The branch electrodes 112 includes a connection portion 1124 and a first branch 1123, and the connection portion 1124 connects the first main electrodes 111 and the first branch 1123. The shape of the connection portion 1124 is a right-angled triangle having a right-angled side flush with a width side of each of the first main electrodes 111, another right-angled side sharing a same edge with the long side of the main electrode 111, and a hypotenuse sharing a same edge with the first branch 1123. The included angle between the hypotenuse of the right-angled triangle and the right-angled side flush with the width side of each of the first main electrodes is the preset angle of 30° to 60°.

Further, the shape of the connection portion 1124 is a right-angled isosceles triangle, and the first branch 1123 is connected to one of opposite ends of each of the main electrodes 111 through the connection portion 1124, and forms a 45° included angle with the main electrodes 111. The first branch 1123 is located on a diagonal of the touch unit and self-symmetrical with respect to the diagonal, and meanwhile, the other diagonal is bilaterally symmetric with each other with respect to the touch unit. Further, the touch unit includes four touch sub-units, and the first branch 1123 is also self-symmetrical with respect to the diagonal of the touch sub-unit. Meanwhile, the first hollow portion 115 is self-symmetrical with respect to the diagonal of the control sub-unit. In an embodiment of the present invention, the diagonal of the touch sub-unit refers to a diagonal that crosses a diagonal of the touch unit, and this limitation is used in the following embodiments for description.

As shown in FIG. 2, the shape of the first branch 1123 is a regular rectangle, and the shape of the first hollow portion 115 is also a regular rectangle. A length of the first branch is less than half a diagonal of the touch unit, that is, less than a length of a diagonal of the touch sub-unit, and the width of the first branch 1123 is greater than or equal to a maximum distance between two adjacent sub-pixels and less than or equal to the maximum distance between five adjacent sub-pixels. The length of the first branch 1123 refers to a length in an extension direction of the first branch 1123, and the width of the first branch 1123 refers to a length in a direction perpendicular to in the extension direction of the first branch 1123. A length of the first hollow portion 115 is smaller than the length of the first branch 1123 and greater than or equal to the maximum distance between two adjacent sub-pixels. A width of the first hollow portion 115 is smaller than the width of the first branch 1123 and greater than or equal to the maximum distance between two adjacent sub-pixels. The first branches 1123 are not in contact with each other.

In other embodiments, the shapes of the first branch 1123 and the first hollow portion 115 may also have a shape of a long zigzag or others.

In this embodiment, by providing the first hollow portion 115 in the first branch 1123, and ensuring a high touch mutual capacitive signal amount while the resistance of the first touch electrode 110 is maintained as small as possible, and reducing the parasitic capacitance between the first touch electrode 110 and a cathode, thereby effectively reducing a charging time of the first touch electrode 110, increasing a scanning frequency of the first touch electrode 110, and realizing a high report rate of the touch screen.

Further, the touch electrode structure further includes a first floating electrode 130 disposed in at least one of the first hollow portion 115 and electrically insulated from the branch electrodes 1123 to ensure optical uniformity of the first touch electrodes 110.

Figure 3:
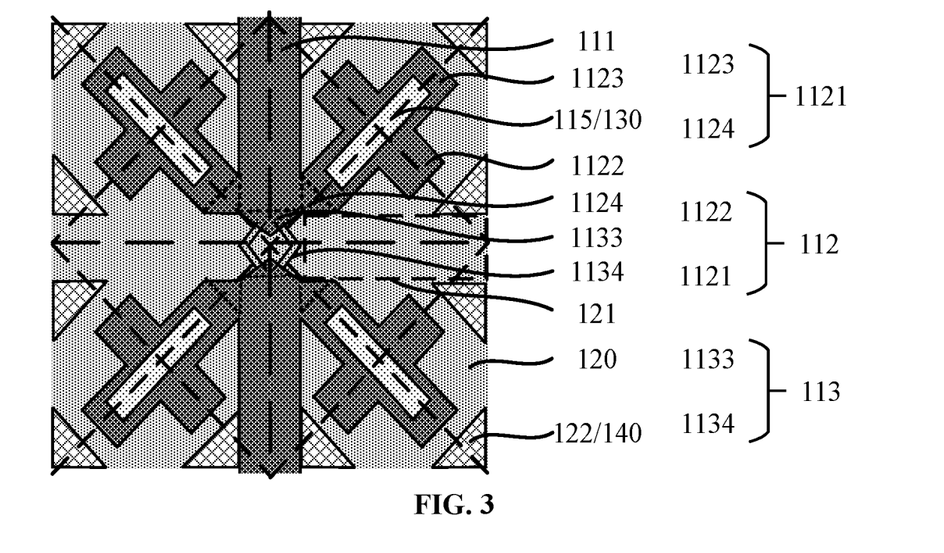
FIG. 3 is a schematic structural diagram of a touch unit provided by a second embodiment of the present application.

In the second embodiment, as shown in FIG. 3, FIG. 3 shows a schematic structural diagram of the touch unit provided by the second embodiment of the present application. The parts of this embodiment that are the same as the first embodiment are not repeated herein for brevity, and specific details may be referred to the first embodiment. The difference between this embodiment and the first embodiment is as follows:

The first channel portion 1133 provided in a layer same as the first main electrodes 111 and the second channel portion 1134 provided in a layer different from the first main electrodes 111 constitute a bridge electrode. The two adjacent first main electrodes 111 are respectively connected to the two first channel portions 1133, and the two first channel portions 1133 are not connected to each other in a plane, and are connected to the same second channel through a via Department 1134 is connected. The second channel portion 1134 may be a double-folded bridge electrode as shown in FIG. 3, or may be a rectangular single bridge electrode along the first direction a.

Each of the branch electrodes 112 includes a first branch portion 1121 and a second branch portion 1122. The first branch portion 1121 further includes a first branch 1123 and a connection portion 1124, the first branch 1123 is connected to one of the main electrodes 111 through the connection portion 1124, and forms a preset included angle with the main electrode 111, wherein the preset angle is 30° to 60°. The second branch portion 1122 and the first branch portion 1121 are arranged crosswise, and are not in contact with the main electrodes 111.

Figure 4:
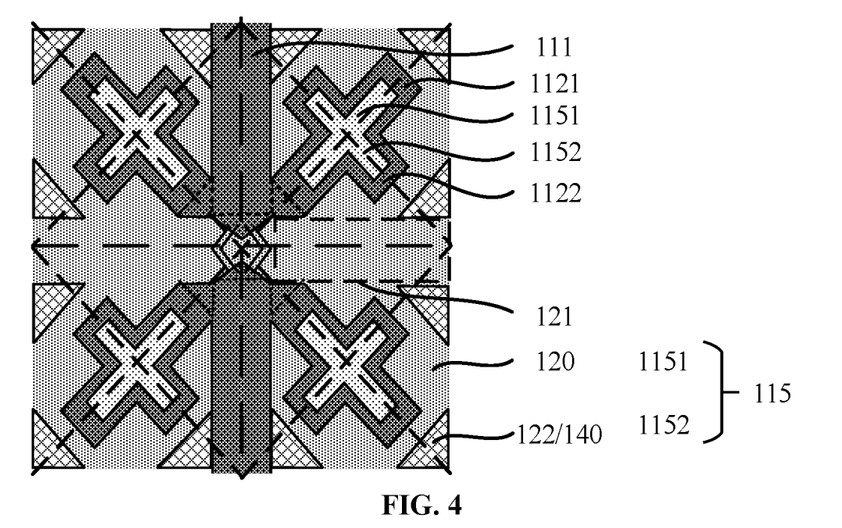
FIG. 4 is a schematic structural diagram of a touch unit provided by a third embodiment of the present application.

The second branch portion 1122 is located on the diagonal of the touch sub-unit and is self-symmetrical with respect to the diagonal of the touch unit. Further, the second branch portion 1122 is also self-symmetrical with respect to the diagonal of the touch sub-unit. Each of the first branch 1123 and the second branch portion 1122 may have a rectangular shape as shown in FIG. 4, or may have a long zigzag shape as shown in FIG. 3, or may have other shapes, which is not particularly limited herein.

The length of the second branch portion 1122 is less than a length of a diagonal of the touch sub-unit, and the width of the second branch portion 1122 is less than or equal to the maximum distance between five adjacent sub-pixels. The length of the second branch portion 1122 refers to the length in the extension direction of the second branch portion 1122, and the width of the second branch portion 1122 refers to a length in a direction perpendicular to the extension direction of the second branch portion 1122.

In one embodiment, as shown in FIG. 3, the first hollow portion 115 is only disposed in each of the first branch portions 1121.

In another embodiment, the first hollow portion 115 is only disposed in each of the second branch portions 1122. A length of the first hollow portion 115 is smaller than the length of a second branch portion 1122 and greater than or equal to the maximum distance between two adjacent sub-pixels. A width of the first hollow portion 115 is smaller than the width of the second branch portion 1122.

In this embodiment, by providing branch electrodes 112 including one first branch portion 1121 and one second branch portion 1122 at one of the opposite ends of each of the main electrodes 111, and disposing the first hollow portion 115 in each of the first branch portions 1121 or the second branch portions 1122, the coupling area between the first touch electrodes 110 and the second touch electrodes 120 is further increased compared with the first embodiment, which further improves the coupling effect and improves mutual capacitance value between the first touch electrodes 110 and the second touch electrodes 120, such that a higher touch mutual capacitive signal amount is ensured, and touch sensitivity is improved.

In the third embodiment, as shown in FIG. 4, FIG. 4 shows a third schematic structural diagram of the touch unit provided by the embodiment of the present application. The parts of this embodiment that are the same as the second embodiment are not repeated herein for brevity, and specific details may be referred to the second embodiment. The difference between this embodiment and the second embodiment is as follows:

Each of the first branch portion 1121 and the second branch portion 1122 is provided with the first hollow portions 115 therein, wherein the first hollow portions 115 included a first part 1151 located in the first branch portion 1121, and a second part 1152 located in the second branch portion 1122.

In this embodiment, by arranging the first hollow portion 115 in each of the first branch portion 1121 and the second branch portion 1122, compared with the third embodiment, the parasitic capacitance between the first touch electrode 110 and the cathode is further reduced, thereby effectively reducing a charging time of the first touch electrode 110, increasing a scanning frequency of the first touch electrode 110, and realizing a high report rate of the touch screen.

Figure 5:
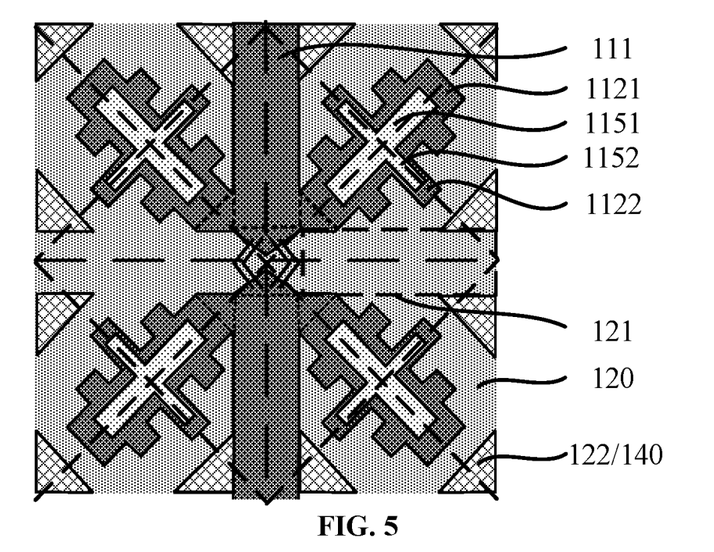
FIG. 5 is a schematic structural diagram of a touch unit provided by a fourth embodiment of the present application.

In the fourth embodiment, as shown in FIG. 5, FIG. 5 shows a schematic structural diagram of the touch unit provided by the fourth embodiment of the present application. The parts of this embodiment that are the same as the third embodiment are not repeated herein for brevity, and specific details may be referred to the third embodiment. The difference between this embodiment and the third embodiment is as follows:

Each branch electrodes 112 includes a first branch portion 1121 and a plurality of second branch portions 1122, and the second branch portions 1122 are parallel to each other. Shapes and sizes of the second branch portions 1122 may be the same or different. Lengths of the second branch portions 1122 may sequentially decrease in a direction away from the diagonal of the touch sub-unit, and widths of the second branch portions 1122 may also sequentially decrease in a direction away from the diagonal of the touch sub-unit.

Each of the first branch portion 1121 and the second branch portion 1122 is provided with the first hollow portions 115 therein, wherein the first hollow portions 115 included a first part 1151 located in the first branch portion 1121, and a second part 1152 located in the second branch portion 1122. Preferably, the second part 1152 may be disposed in the second branch portion 1122 located on the diagonal of the touch control sub-unit.

In this embodiment, by providing a branch electrode 112 including one first branch portion 1121 and a plurality of second branch portions 1122, compared with the third embodiment, the coupling area between the first touch electrodes 110 and the second touch electrodes 120 is further increased, thereby further improving the coupling effect and improving mutual capacitance value between the first touch electrodes 110 and the second touch electrodes 120, such that a higher touch mutual capacitive signal amount is ensured, and touch sensitivity is improved.

Figure 6:
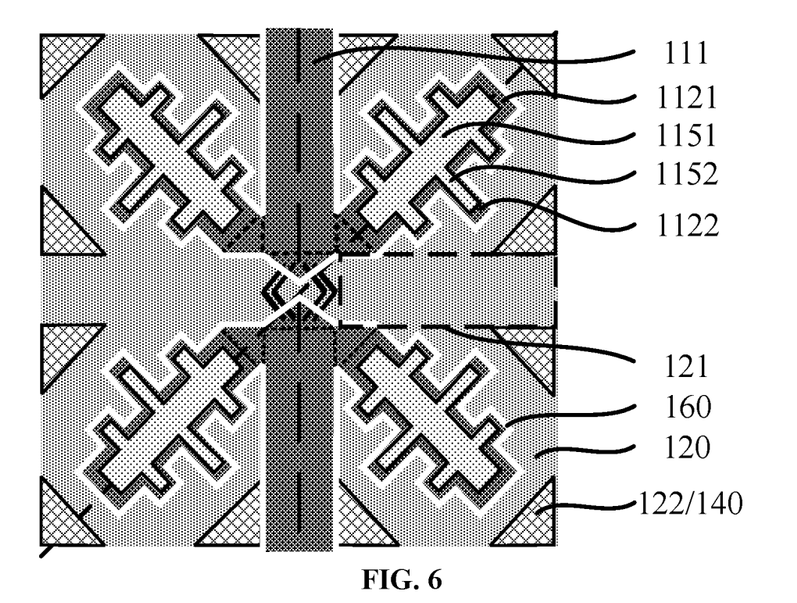
FIG. 6 is a schematic structural diagram of a touch unit provided by a fifth embodiment of the present application.

In the fifth embodiment, as shown in FIG. 6, FIG. 6 shows a structural schematic diagram of the touch unit provided by the fifth embodiment of the present application. The parts of this embodiment that are the same as the fourth embodiment are not repeated herein for brevity. The difference between this embodiment and the fourth embodiment is as follows:

Each of the first branch portion 1121 and at least two of the second branch portions 1122 is provided with a first hollow portion 115, wherein the first hollow portion 115 includes a first part 1151 located in the first branch portion 1121 and second part 1152 located in the second branch 1122.

In this embodiment, by arranging the first hollow portion 115 in each of the first branch portion 1121 and at least two of the second branch portions 1122, compared with the third embodiment, the parasitic capacitance between the first touch electrode 110 and the cathode is further reduced, thereby effectively reducing a charging time of the first touch electrode 110, increasing a scanning frequency of the first touch electrode 110, and realizing a high report rate of the touch screen.

In the sixth embodiment, as shown in FIG. 1, the touch electrode structure further includes a third floating electrode 150, and the third floating electrode 150 is disposed between adjacent ones of the second touch electrodes 120 and insulated from the second touch electrodes 120, so as to effectively electrically isolate the second touch electrodes 120 of adjacent channels, and prevent the channels of adjacent ones of the second touch electrodes from short-circuiting. The third floating electrode 150 is also insulated from the first touch electrodes 110. A width of the third floating electrode 150 is greater than the width of one sub-pixel and less than or equal to the maximum distance between two adjacent sub-pixels.

The first touch electrodes 110 and the second touch electrodes 120 are insulated from each other by a fracture, and the distance between the first touch electrodes 110 and the second touch electrodes 120 is relatively short, thereby ensuring a larger mutual capacitance value between the first touch electrodes 110 and the second touch electrodes, which is beneficial to increase an amount of change in the capacitance of a side field between the first touch electrodes 110 and the second touch electrodes 120 when it is touched by a finger, such that touch mutual capacitive signal amount is increased, and touch sensitivity is improved.

In the seventh embodiment, as shown in FIG. 6, the difference between this embodiment and the sixth embodiment is as follows:

The touch electrode structure further includes a fourth floating electrode 160 disposed between the first touch electrodes 110 and the second touch electrodes 120 for electrically isolating the first touch electrodes 110 from the second touch electrodes 120. A width of the fourth floating electrode 160 is greater than the width of one sub-pixel and less than or equal to the maximum distance between two adjacent sub-pixels. The fourth floating electrode 160 can effectively reduce the basic mutual capacitance value, thereby increasing a change of the basic mutual capacitance value when it is touched by a finger.

Figure 7:
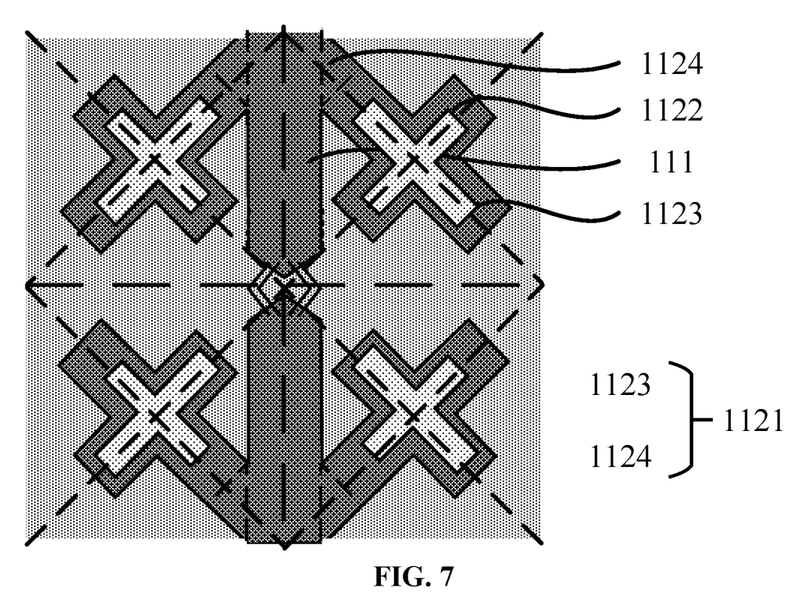
FIG. 7 is a schematic structural diagram of a touch unit provided by a sixth embodiment of the present application.

In the eighth embodiment, as shown in FIG. 7, FIG. 7 shows a structural schematic diagram of the touch unit provided by the sixth embodiment of the present application. The parts of this embodiment that are the same as the third embodiment are not repeated herein for brevity. The difference between this embodiment and the third embodiment is as follows:

The branch electrodes 112 are connected to middle portions of the first main electrodes 111. The first branch portion 1121 is disposed on a diagonal of the touch sub-unit, and the second branch portion 1122 and the first branch portion 1121 are cross-connected. The first branch portions 1121 may contact each other or not. Further, the second branch portion 1122 is disposed on the diagonal of the touch unit, and the second branch portions 1122 are not in contact with each other. Still further, the second branch portion 1122 is self-symmetrical with respect to the diagonal of the touch unit. Yet further, the second branch portion 1122 is self-symmetrical with respect to the diagonal of the touch sub-unit.

In this embodiment, by providing branch electrodes 112 including one first branch portion 1121 and one second branch portion 1122 in a middle portion of each of the main electrodes 111, the coupling area between the first touch electrodes 110 and the second touch electrodes 120 is further increased, which further improves the coupling effect and improves mutual capacitance value between the first touch electrodes 110 and the second touch electrodes 120, such that a higher touch mutual capacitive signal amount is ensured, and touch sensitivity is improved. Further, by arranging the first hollow portion 115 in each of the first branch portion 1121 and the second branch portion 1122, the parasitic capacitance between the first touch electrode 110 and the cathode is reduced, thereby effectively reducing a charging time of the first touch electrode 110, increasing a scanning frequency of the first touch electrode 110, and realizing a high report rate of the touch screen.

In another embodiment, the second hollow portion 122 is provided in at least one of the second touch electrodes 120, and by providing the second hollow portion 122 in the branch electrode 112, the parasitic capacitance between the second touch electrode and the cathode is reduced, thereby effectively reducing the RC delay of the channels of the first touch electrodes, reducing the time required for screen scanning, and thereby effectively increasing the touch report rate. The second hollow portion 122 provided outside the second main electrode 121 ensures a smaller impedance of the second touch electrode channel, thereby effectively reducing the RC delay of the channels of the first touch electrodes, reducing the time required for screen scanning, and thereby effectively increasing the touch report rate.

In one embodiment, as shown in FIG. 1 to FIG. 6, the second hollow portion 122 is disposed at each of vertex positions of the pixel sub-units, and the vertex positions include three vertex positions other than the vertex position at intersection between the first touch electrode 110 and the second touch electrode 120. The second hollow portion 122 avoids both of the first main electrodes 111 and the second main electrodes 121, that is, the second hollow portion 122 is provided outside the first main electrodes 111 and the second main electrodes 121. The second hollow portion 122 is not in contact with and electrically insulated from the first touch electrode 110 and the second touch electrode 120. A shape of the second hollow portion 122 includes but is not limited to a triangle, preferably a right triangle. The shapes or sizes of the second hollow portions 122 may be the same or different, which is not particularly limited herein.

The hollow portion 122 is symmetrical with respect to the first centerline and the second centerline of the first main electrodes 111.

Further, the touch electrode structure further includes a second floating electrode 140, the second floating electrode 140 is disposed in at least one of the second hollow portions 122, and is electrically insulated from the second touch electrodes 120, thereby ensuring the optical uniformity of the second touch electrodes 120.

In yet another embodiment, at least one of the branch electrodes 112 is provided with the first hollow portion 115, and at least one of the second touch electrodes 120 is provided with the second hollow portion 122. Further, the touch electrode structure further includes a first floating electrode 130 and a second floating electrode 140, and the first floating electrode 130 is disposed in at least one of the first hollow portions 115 and electrically insulated from the branch electrode 112. The second floating electrode 140 is disposed in at least one of the second hollow portions 122 and electrically insulated from the second touch electrode 120. In this embodiment, the parasitic capacitance between the entire channels of the first touch electrode, the second touch electrode, and the cathode is reduced, thereby effectively reducing the RC delay of the channels of the first touch electrodes and the second touch electrodes, reducing the time required for screen scanning, and thereby effectively increasing the touch report rate.

In the touch electrode structure provided by an embodiment of the present application, in the touch unit 101, an effective area of the first touch electrodes 110 is smaller than an effective area of the second touch electrodes 120, wherein the effective area of the first touch electrodes 110 refers to an area excluding the location of the first hollow portion 115, and the effective area of the second touch electrodes 120 refers to an area excluding the location of the second hollow portion 122. The parasitic capacitance formed between the first touch electrodes 110 and the cathode is less than the parasitic capacitance formed between the second touch electrodes 120 and the cathode. In the touch unit, the parasitic capacitance between the first touch electrodes 110 and the cathode is less than 8 picofarads, and the parasitic capacitance between the second touch electrodes 120 and the cathode is less than 10 picofarads.

In the touch unit 101, a ratio of an area occupied by the first floating electrode 130 to the effective area of the first touch electrode 110 is less than 1; and a ratio of an area occupied by the second floating electrode 140 to the effective area of the second touch electrode 120 is less than 1, thereby ensuring the effective electrode areas of the first touch electrode 110 and the second touch electrode 120, thus ensuring a higher touch mutual capacitive signal amount.

In the touch electrode structure provided by the embodiment of the present application, each of the first touch electrode 110, the second touch electrode 120, the first floating electrode 130, the second floating electrode 140, the third floating electrodes 150, and the fourth floating electrode 160 may be a transparent and conductive thin film, or may also be an opaque grid-like metal, wherein the metal grid avoids light-emitting areas of the sub-pixels, that is, grid lines of the metal grid correspond to interval regions of the sub-pixels, and the sub-pixels correspond to transmitting regions enclosed by the grid lines.

The touch electrode structure provided by the embodiments of the present application are not isolated from each other, and those skilled in the art may combine different embodiments or combine their technical inspirations to obtain better results.

Figure 8:
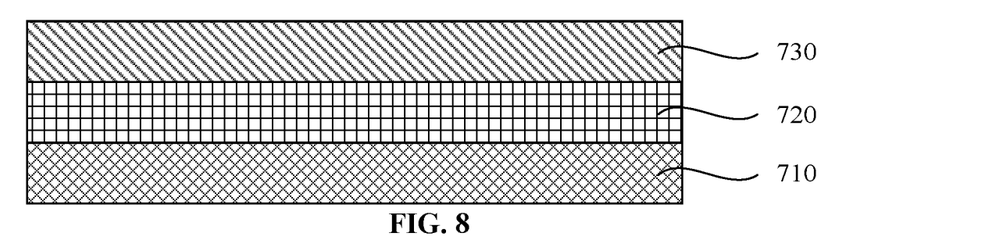
FIG. 8 is a schematic structural diagram of a touch display panel provided by an embodiment of the present application.

Meanwhile, the present application also provides a touch display panel, referring to FIG. 8, which shows a schematic structural diagram of a touch display panel provided by an embodiment of the present application. As shown in FIG. 8, the touch display panel includes:

a display layer 710;

a thin film encapsulation layer 720 arranged on the display layer 710;

a touch layer 730 disposed on the thin film encapsulation layer 720, wherein the touch layer 730 includes the touch electrode structure provided by an embodiment of the present application, and the touch electrode structure includes: a plurality of first touch electrodes arranged in parallel, wherein the first touch electrodes include a plurality of first main electrodes connected end to end along a first direction and continuously conducted and branch electrodes connected to the first main electrodes, each of the branch electrodes includes a first branch portion and a second branch portion, the first branch portion is connected to the first main electrodes, the second branch portion is cross-connected to the first branch portion without contacting the first main electrodes; and a plurality of second touch electrodes arranged in parallel, wherein the second touch electrodes include a plurality of second main electrodes connected end to end in a second direction and continuously conducted, the second touch electrodes arranged around the branch electrodes and the first main electrodes, and electrically insulated from the first touch electrodes; the second direction and the first direction are perpendicular to each other, the first touch electrodes and the second touch electrodes intersect each other to form a plurality of repeatedly arranged touch units, wherein at least one of the branch electrodes is provided with a first hollow portion, or/and at least one of the second touch electrodes is provided with a second hollow portion disposed outside the second main electrodes.

This embodiment provides a touch display panel including the touch electrode structure provided in an embodiment of the present application. In the touch electrode structure, In the touch electrode structure, the arrangement of the first hollow portion in the branch electrode reduces the parasitic capacitance between the first touch electrode and the cathode, and the arrangement of the second hollow portion in the second touch electrode reduces the parasitic capacitance between the second touch electrode and the cathode, thereby effectively reducing the RC delay of the first touch electrodes and the second touch electrodes, reducing the time required for screen scanning, and thereby effectively increasing the touch report rate. The arrangement of the first main electrodes facilitates the conduction of current in a direction of a channel of the first touch electrodes, greatly reducing the impedance of a channel of the touch electrodes, and the arrangement of the second main electrodes facilitates the conduction of current in a direction of a channel of second first touch electrodes, greatly reducing the impedance of a channel of the touch electrodes, thereby effectively reducing the RC delay of the first touch electrodes, reducing the time required for screen scanning, and thereby effectively increasing the touch report rate. In addition, the arrangement of the branch electrodes and the arrangement of the second touch electrode around the branch electrodes and the first main electrodes improve the coupling effect between the first touch electrodes and the second touch electrodes, which effectively elevates a mutual capacitance value between the first touch electrodes and the second touch electrodes, such that a higher touch mutual capacitive signal amount is ensured, and touch sensitivity is improved.

Figure 9:
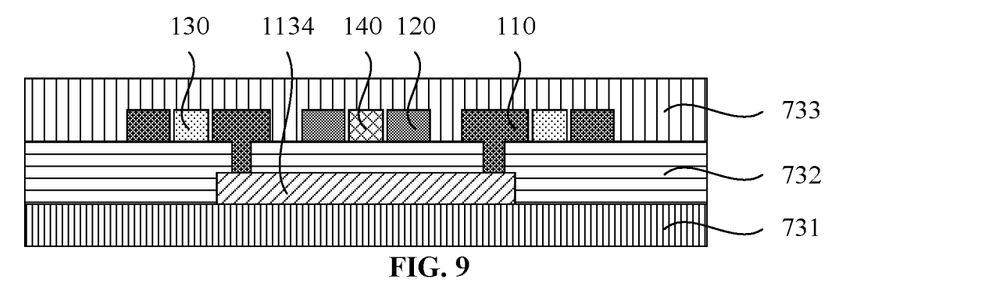
FIG. 9 is a schematic structural diagram of a touch layer provided by an embodiment of the present application.

In an embodiment, referring to FIG. 9, which shows a schematic structural diagram of a touch layer provided by an embodiment of the present application. As shown in FIG. 9, the touch layer 730 includes:
- a buffer layer 731;
- a first metal layer disposed on the buffer layer 731 and patterned to form a bridge electrode 1134;
- a first insulating layer 732 covering the bridge electrode 1134;
- a second metal layer disposed on the first insulating layer 732, and patterned to form a first touch electrode 110, a second touch electrode 120, a first floating electrode 130, and a second floating electrode 140, wherein the first floating electrode 130 is located in the first touch electrode 110 and insulated from the first touch electrode 110, and the second floating electrode 140 is located in the second touch electrode 120 and insulated from the second touch electrodes 120; the first touch electrodes 110 is connected to the bridge electrode 1134 through a via hole to achieve continuous conduction of the first touch electrodes 110 in the first direction; and
- a second insulating layer 733 covering the first touch electrodes 110 and the second touch electrodes 120.

In another embodiment, the first touch electrodes 110 include a channel electrode disposed in a layer same as the first touch electrodes 110, and the channel electrode is connected to two adjacent first main electrodes to realize the continuous conduction of 110 the first touch electrodes in the first direction. Meanwhile, the second touch electrodes 120 realizes continuous conduction in the second direction through a bridge electrode disposed in a different layer.

In yet another embodiment, the first touch electrodes 110 are provided in a layer different from the second touch electrodes 120.

Since the touch display panel provided in this embodiment includes the touch electrode structure provided in an embodiment of the present application, it has the beneficial effects of the touch electrode structure provided in an embodiment of the present application, specific working principles and implementation can be referred to the above embodiments, and details are not repeated herein for brevity.

According to the above embodiment, it is known that:

Embodiments of the present application provides a touch electrode structure and a touch display panel. The touch electrode structure includes: a plurality of first touch electrodes arranged in parallel, wherein the first touch electrodes include a plurality of first main electrodes connected end to end along a first direction and continuously conducted and branch electrodes connected to the first main electrodes, each of the branch electrodes includes a first branch portion and a second branch portion, the first branch portion is connected to the first main electrodes, the second branch portion is cross-connected to the first branch portion without contacting the first main electrodes; and a plurality of second touch electrodes arranged in parallel, wherein the second touch electrodes include a plurality of second main electrodes connected end to end in a second direction and continuously conducted, the second touch electrodes arranged around the branch electrodes and the first main electrodes, and electrically insulated from the first touch electrodes; the second direction and the first direction are perpendicular to each other, the first touch electrodes and the second touch electrodes intersect each other to form a plurality of repeatedly arranged touch units, wherein at least one of the branch electrodes is provided with a first hollow portion, or/and at least one of the second touch electrodes is provided with a second hollow portion disposed outside the second main electrodes. In the touch electrode structure, In the touch electrode structure, the arrangement of the first hollow portion in the branch electrode reduces the parasitic capacitance between the first touch electrode and the cathode, and the arrangement of the second hollow portion in the second touch electrode reduces the parasitic capacitance between the second touch electrode and the cathode, thereby effectively reducing the RC delay of the first touch electrodes and the second touch electrodes, reducing the time required for screen scanning, and thereby effectively increasing the touch report rate. The arrangement of the first main electrodes facilitates the conduction of current in a direction of a channel of the first touch electrodes, greatly reducing the impedance of a channel of the touch electrodes, and the arrangement of the second main electrodes facilitates the conduction of current in a direction of a channel of second first touch electrodes, greatly reducing the impedance of a channel of the touch electrodes, thereby effectively reducing the RC delay of the first touch electrodes, reducing the time required for screen scanning, and thereby effectively increasing the touch report rate. In addition, the arrangement of the branch electrodes and the arrangement of the second touch electrode around the branch electrodes and the first main electrodes improve the coupling effect between the first touch electrodes and the second touch electrodes, which effectively elevates a mutual capacitance value between the first touch electrodes and the second touch electrodes, such that a higher touch mutual capacitive signal amount is ensured, and touch sensitivity is improved.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A touch electrode structure, comprising:
a plurality of first touch electrodes arranged in parallel, wherein the first touch electrodes comprise a plurality of first main electrodes connected end to end along a first direction and electrically conducted along the first direction and branch electrodes connected to the first main electrodes, each of the branch electrodes comprises a first branch portion and a second branch portion, the first branch portion is connected to the first main electrodes, and the second branch portion is cross-connected to the first branch portion without contacting the first main electrodes; and
a plurality of second touch electrodes arranged in parallel, wherein the second touch electrodes comprise a plurality of second main electrodes connected end to end in a second direction and continuously connected along the second direction, the second touch electrodes are arranged around the branch electrodes and the first main electrodes, and electrically insulated from the first touch electrodes; the second direction and the first direction are perpendicular to each other, and the first touch electrodes and the second touch electrodes intersect each other to form a plurality of repeatedly arranged touch units,
wherein at least one of the branch electrodes is provided with a first hollow portion, or/and at least one of the second touch electrodes is provided with a second hollow portion disposed outside the second main electrodes, and wherein the first branch portion extends along a direction between the first and second directions, wherein the first branch portion comprises a connection portion and a first branch, and the first branch is connected to one of the first main electrodes through the connection portion, and wherein each of the first main electrodes has a geometric shape of rectangle having a long side along the first direction, and the connection portion has a geometric shape of a right angle triangle having a right-angled side flush with a width side of each of the main electrodes, another right-angled side sharing a same edge with the long side of the first main electrode, and a hypotenuse sharing a same edge with the first branch.

2. The touch electrode structure according to claim 1, wherein at least one of the branch electrodes is provided with the first hollow portion, and the touch electrode structure further comprises a first floating electrode disposed in at least one of the first hollow portion and electrically insulated from the branch electrodes.

3. The touch electrode structure according to claim 1, wherein at least one of the second touch electrodes is provided with the second hollow portion, and the touch electrode structure further comprises a second floating electrode disposed in at least one of the second hollow portion and electrically insulated from the second touch electrodes.

4. The touch electrode structure according to claim 1, wherein in the touch units, an effective area of each of the first touch electrodes is smaller than an effective area of each of the second touch electrodes, the effective area of the touch electrodes refers to an area excluding an area of the first hollow portion, and the effective area of each of the second touch electrodes refers to an area excluding an area of the second hollow portion.

5. The touch electrode structure according to claim 1, wherein in the touch units, a ratio of an area of the first hollow portion to an effective area of each the first touch electrodes is less than 1, and the effective area of each of the first touch electrodes refers to an area excluding an area of the first hollow portion.

6. The touch electrode structure according to claim 1, wherein in the touch units, a ratio of an area of the second hollow portion to an effective area of each of the second touch electrodes is less than 1, and the effective area of each of the second touch electrodes refers to an area excluding an area of the second hollow portion.

7. The touch electrode structure according to claim 1, wherein the first touch electrodes are arranged at intervals along the second direction, and a number of the first touch electrodes is even.

8. The touch electrode structure according to claim 1, wherein, in the touch units, the first main electrodes comprise a first centerline along the first direction and a second centerline along the second direction, and the first main electrodes are symmetrical with respect to the first centerline and symmetrical with respect to the second centerline.

9. The touch electrode structure according to claim 8, wherein the second touch electrodes are symmetrical with respect to the first centerline and symmetrical with respect to the second centerline.

10. The touch electrode structure according to claim 1, wherein each of the branch electrodes are connected to one of opposite ends of the first main electrodes, and the branch electrodes are not in contact with each other.

11. The touch electrode structure according to claim 1, wherein each of the branch electrodes are connected to a middle portion of one of the first main electrodes.

12. The touch electrode structure according to claim 1, wherein the touch units comprise four touch sub-units, the first branch portion is disposed on a diagonal of each of the touch sub-units, and the second branch portion is disposed on another diagonal of each of the touch sub-units.

13. The touch electrode structure according to claim 1, wherein the touch electrode structure further comprises a third floating electrode disposed between adjacent ones of the second touch electrodes to electrically isolate the second touch electrodes, and the third floating electrode is electrically insulated from the second touch electrodes and the first touch electrodes.

14. The touch electrode structure according to claim 1, wherein a length of each of the first branch portion and the second branch portion is less than half a diagonal of each of the touch units, the length of the first branch portion refers to a length in an extension direction of the first branch portion, and the length of the second branch portion refers to a length in an extension direction of the second branch portion.

15. The touch electrode structure according to claim 14, wherein a width of the first branch portion is less than or equal to a width of each of the first main electrodes, a width of the second branch is less than or equal to the width of the first branch portion, the width of each of the first main electrodes refers to a length of the first main electrodes in the second direction, the width of the first branch portion refers to a length in a direction perpendicular to the extension direction of the first branch portion, and the width of the second branch portion refers to a length in a direction perpendicular to the extension direction of the second branch portion.

16. A touch display panel, comprising:
a display layer;
a thin film encapsulation layer arranged on the display layer; and
a touch layer disposed on the thin film encapsulation layer, wherein the touch layer comprises the touch electrode structure according to claim 1.

* * * * *